US009305674B1

(12) United States Patent
Wertsching et al.

(10) Patent No.: US 9,305,674 B1
(45) Date of Patent: Apr. 5, 2016

(54) METHOD AND DEVICE FOR SECURE, HIGH-DENSITY TRITIUM BONDED WITH CARBON

(75) Inventors: Alan Kevin Wertsching, Idaho Falls, ID (US); Troy Joseph Trantor, Mena, AR (US); Rhonda Tranter, legal representative, Mena, AR (US); Matthias Anthony Ebner, Idaho Falls, ID (US); Brad Curtis Norby, Iona, ID (US)

(73) Assignee: U.S. Department of Energy, Washington, DC (US)

( * ) Notice: Subject to any disclaimer, the term of this patent is extended or adjusted under 35 U.S.C. 154(b) by 972 days.

(21) Appl. No.: 13/427,165

(22) Filed: Mar. 22, 2012

(51) Int. Cl.
*H01L 31/02* (2006.01)
*G21H 1/12* (2006.01)
*H01L 31/04* (2014.01)

(52) U.S. Cl.
CPC .............. *G21H 1/12* (2013.01); *H01L 31/0406* (2013.01)

(58) Field of Classification Search
CPC .............................. H01L 31/0406; H02N 6/00
USPC ............ 136/253; 423/249, 253; 310/303, 309
See application file for complete search history.

(56) References Cited

U.S. PATENT DOCUMENTS

| | | | | |
|---|---|---|---|---|
| 4,242,147 | A * | 12/1980 | DeToia | 136/253 |
| 4,275,405 | A * | 6/1981 | Shannon | 257/252 |
| 5,082,505 | A * | 1/1992 | Cota et al. | 136/253 |
| 5,124,610 | A * | 6/1992 | Conley et al. | 310/303 |
| 5,164,809 | A * | 11/1992 | Street et al. | 257/55 |
| 5,443,657 | A * | 8/1995 | Rivenburg et al. | 136/253 |
| 5,606,213 | A * | 2/1997 | Kherani et al. | 310/303 |
| 5,859,484 | A * | 1/1999 | Mannik et al. | 310/303 |
| 6,479,743 | B2 * | 11/2002 | Vaz | 136/253 |
| 8,134,275 | B2 * | 3/2012 | Kavetsky et al. | 310/303 |
| 2003/0015661 | A1 * | 1/2003 | Lee et al. | 250/315.3 |
| 2011/0291210 | A1 * | 12/2011 | Batchelder | 257/429 |

* cited by examiner

*Primary Examiner* — Golam Mowla
(74) *Attorney, Agent, or Firm* — Felisa L. Leisinger; Michael J. Dobbs; John T. Lucas

(57) ABSTRACT

A method and device for producing secure, high-density tritium bonded with carbon. A substrate comprising carbon is provided. A precursor is intercalated between carbon in the substrate. The precursor intercalated in the substrate is irradiated until at least a portion of the precursor, preferably a majority of the precursor, is transmutated into tritium and bonds with carbon of the substrate forming bonded tritium. The resulting bonded tritium, tritium bonded with carbon, produces electrons via beta decay. The substrate is preferably a substrate from the list of substrates consisting of highly-ordered pyrolytic graphite, carbon fibers, carbon nanotunes, buckministerfullerenes, and combinations thereof. The precursor is preferably boron-10, more preferably lithium-6. Preferably, thermal neutrons are used to irradiate the precursor. The resulting bonded tritium is preferably used to generate electricity either directly or indirectly.

16 Claims, 3 Drawing Sheets

METHOD AND DEVICE FOR SECURE, HIGH-DENSITY TRITIUM BONDED WITH CARBON

GOVERNMENT INTERESTS

The United States Government has rights in this invention pursuant to Contract No. DE-AC07-05ID14517, between the U.S. Department of Energy (DOE) and the Battelle Energy Alliance (BEA).

CROSS-REFERENCE TO RELATED APPLICATIONS

1. Field of the Invention

The present invention relates to a method and device for secure, high-density tritium bonded with carbon, preferably by irradiating an intercalated precursor into tritium bonded with carbon in a substrate.

2. Background of the Invention

There has been and continues to be a great interest in new and improved energy sources. One interest is in reliable long-term energy. For example, medical devices, long-range sensors (e.g. down-hole well sensors), extreme environment sensors (e.g. deep ocean, vacuum of space, high altitude, etc.) and long-term storage (e.g. nuclear waste monitoring), greatly depend on long-term, reliable energy sources. Radioactive sources, such as tritium, have been used as an energy source for many years. Over 50 years ago, early pacemakers used radioactive sources for long-term use. However, these devices were discontinued in favor of batteries after significant advancements in battery technology. Recent advancements in semiconductor technologies have made energy conversion from low-energy radioactive sources, such as tritium, a viable solution for high-energy electronics as well as increased efficiencies. Tritium still remains a significant health concern, unless properly secured. However, current efforts to safely secure tritium result in a low-density tritium, minimizing tritium's potential as a significant energy source. For example, in an existing solution, a tritium gas is absorbed into a porous silicon carbide substrate, which is limited by the surface area of the substrate, resulting in a low-density bulky substrate. As the resulting tritium is secured in a low-density form, it is virtually unusable for use in energy production, due to cost efficiencies, and the size of energy source. Therefore, there is a need for a device and method for the secure, high-density storage of tritium.

SUMMARY OF THE INVENTION

A method and device for producing secure, high-density tritium bonded with carbon. A substrate comprising carbon is provided. A precursor is intercalated between carbon in the substrate. The precursor intercalated in the substrate is irradiated until at least a portion of the precursor, preferably a majority of the precursor, is transmutated into tritium and bonds with carbon of the substrate forming bonded tritium, tritium bonded with carbon. The resulting bonded tritium produces electrons via beta decay. The substrate is preferably a substrate from the list of substrates consisting of highly-ordered pyrolytic graphite, carbon fibers, carbon nanotunes, buckminsterfullerenes, and combinations thereof. The precursor is preferably boron-10, more preferably lithium-6. Preferably, thermal neutrons are used to irradiate the precursor. Preferably, the resulting bonded tritium is used in a long-term power source (preferably between 10 and 20 years), capable of operating under extreme environments (e.g. deep ocean, vacuum of space, high altitude, etc.) and under extreme temperatures (preferably up to 300° F.).

DETAILED DESCRIPTION OF THE INVENTION

Figure 1A:
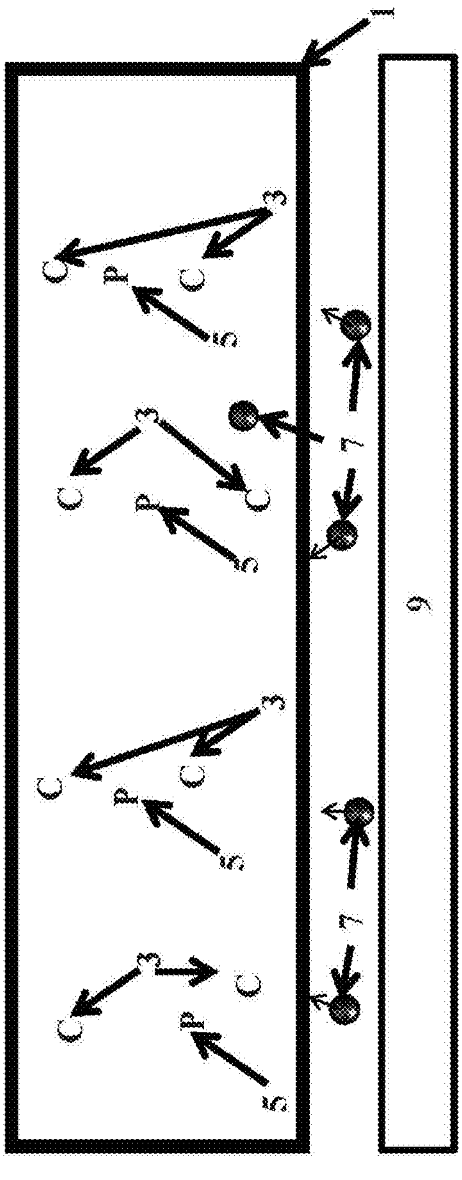
FIG. 1*a* depicts a preferred embodiment of a substrate comprising a precursor intercalated between carbon graphene layers in a substrate.

A method and device for producing secure, high-density tritium bonded with carbon. A substrate comprising carbon is provided. A precursor is intercalated between carbon in the substrate. Preferably, the precursor forms a covalent bond with carbon in the substrate. The precursor intercalated in the substrate is irradiated until at least a portion of the precursor, preferably a majority of the precursor, is transmutated into tritium and bonds with carbon of the substrate forming bonded tritium, tritium bonded with carbon. Preferably, tritium forms a covalent bond with carbon in the substrate. The resulting bonded tritium produces electrons via beta decay. The substrate is preferably a substrate from the list of substrates consisting of highly-ordered pyrolytic graphite, carbon fibers, carbon nanotunes, buckminsterfullerenes, and combinations thereof. The precursor is preferably boron-10, more preferably lithium-6. Preferably, thermal neutrons are used to irradiate the precursor.

Preferred embodiments also include cleaving, peeling, milling or machining micron thin sheets of the bonded tritium. The carbon structure of the resulting bonded tritium are ideal and are preferably eventually manufactured into extremely thin wafers or powders, thus minimizing internal absorption or loss of electrons emitted and maximize the amount of captured electrons.

Preferably, the resulting bonded tritium is used in long-term power source (preferably between 10 and 20 years), capable of operating under extreme environments (e.g. deep ocean, vacuum of space, high altitude, etc.) and under extreme temperatures (up to 300° F.). In one embodiment, the bonded tritium is used to generate electricity, which is used to trickle charge a primary battery. In one embodiment, the resulting bonded tritium is positioned in electron communication with a p-n junction, whereby the electrons generated from beta decay are captured by the p-n junction and generate electricity for power generation. In another embodiment, a phosphor screen receives electrons generated from beta decay from the resulting bonded tritium and generates photons which are subsequently received by a photocell for power generation. The power density of the tritiated substrate is preferably at least 1 mW/cc. The resulting product is a secure, high-density tritium source, which produces electrons with inert helium and graphite, two very safe bi-products. Other uses for a secure, high-density tritium source, include, but are not limited to, medical devices, research equipment, detectors, etc. Preferably, any resulting products incorporated the bonded tritium source comprises a means for venting, capturing or containing the helium bi-product.

Substrate

The substrate comprises carbon. Preferably, the substrate is rigid and comprises ample space for loading of the precursor. Preferably, the substrate has a thickness sufficient to contain the resulting nuclear reaction during irradiation, depending on various factors, for example substrate material, neutron energy, etc. The substrate is positioned to provide at least the majority of neutrons passing through the thickness of the substrate. Some matrix damage to the substrate during irradiation is expected, for example from the recoil event and ionization pathway, but these defects or vacancies become additional sites for tritium to bond with carbon within the substrate.

In one embodiment, the substrate is preferably a large size for ease of handling during production, for example 10×10×1 mm. Preferably, the substrate is carbon in a graphite form, due to graphite's resistance to damage from neutron flux. More preferably the substrate is highly-ordered pyrolytic graphite (HOPG), carbon fibers, carbon nanotunes, buckminsterfullerenes, or combinations thereof.

In a preferred embodiment, the substrate is highly-ordered pyrolytic graphite (HOPG); and atoms of the precursor are located in the interplanar space between the graphene layers and individually spaced under the graphene rings of the substrate. HOPG is graphite with an angular spread between the graphite sheets of less than 1 degree. HOPG is preferred, as the carbon in the HOPG has a low probability of undesired reaction within a thermal neutron flux.

Precursor

The precursor is any one or more elements that when irradiated form tritium. Preferably, the precursor is lithium, boron, and combinations thereof. More preferably, the precursor is lithium-6, boron-10, and combinations thereof. Preferably, the precursor forms a covalent bond with carbon in the substrate. Preferably, the precursor is a single element or composition to provide uniformity in the final bonded tritium and to allow for an optimized irradiation for just the single element or composition. Preferably, the precursor is lithium-6 and bonds with carbon in the substrate forming at least a portion of, preferably at least a majority of $^6LiC_6$, due to its relative ease in transmutation to tritium. Preferably, the forming of $^6LiC_6$ within the substrate is maximized, due to $^6LiC_6$ favorable conversion to tritium. A lithium-6 precursor bonded, preferably covalently bonded, with carbon in the substrate may form various other stoicheiometries with any number of lithiums, for example forming $^6LiC_{18}$, depending on various factors such as the length of exposure of the substrate to Li, temperature during exposure, etc.

The precursor is intercalated with carbon in the substrate, whereby the precursor is positioned between at least two carbon atoms of the substrate. In a preferred embodiment, the substrate is highly-ordered pyrolytic graphite (HOPG); and the precursor is intercalated with carbon in the substrate, whereby the atoms of the precursor are located in the interplanar space between the graphene layers and individually spaced under the graphene rings of the substrate. The precursor may be intercalated using various methods, for example the methods described in U.S. Pat. Nos. 4,604,276 and 4,388,227, hereby fully incorporated by reference. In a preferred embodiment the substrate is completely immersed in molten precursor, preferably molten Li-6 metal. Preferably, the substrate is completely immersed in the molten precursor for less than 8 hours, preferably under a dry argon atmosphere (e.g. glove box). This embodiment is preferred as it is cleaner than the other methods, for example electrochemical intercalation.

Irradiation

Preferably, the precursor is irradiated with thermal neutrons. Preferably, the precursor is irradiated for a time optimized to transmutate at least a portion, preferably a majority, of the precursor to tritium. Preferably, the precursor is exposed to thermal neutrons for one to five months, depending on various factors, for example, neutron flux, substrate material, substrate thickness, etc.

The neutron source generates neutrons, preferably thermal neutrons. In a preferred embodiment, the neutron source is a nuclear reactor, preferably a thermal reactor. In one embodiment, the neutron source is a compact neutron source, for example as described in Ser. No. 12/303,851, hereby fully incorporated by reference. Preferably, the neutron source is optimized for a high thermal neutron flux. It is estimated that in a thermal reactor, about 10% of a precursor made of Li-6 will be converted in 16 days, about 30% of a precursor made of Li-6 will be converted in 55 days, and about 50% of a precursor made of Li-6 will be converted in 107 days.

For example, the irradiation of Li-6 into tritium will be governed by the following equation 1.

$$\frac{dN^{H^3}}{dt} = \frac{dN^{Li-6}}{dt} = N^{Li-6}\phi\sigma_{(n,\alpha)}^{Li-6} \quad \text{Eq. 1}$$

Whereby, $N^{H^3}$ is the population of tritium; $N^{Li-6}$ is the population of Li-6; $\emptyset$ is the neutron flux; t is irradiation time, and $\sigma_{(n,\alpha)}{}^{Li-6}$ relates to the neutron and alpha particle absorption into the Li-6. The equation may be simplified to the following Eq.2 using $No^{Li-6}$, the initial population of Li-6, for the constant after integration.

$$N^{H^3} = No^{Li-6} - No^{Li-6} * e^{-\phi\sigma_{(n,\alpha)}^{Li-6}t} \quad \text{Eq. 2}$$

Where, $N^{H^3}$ is the population of tritium; $No^{Li-6}$ is the initial population of Li-6; $\emptyset$ is the neutron flux; t is time, and $$\sigma_{(n,\alpha)}^{Li-6}$$

relates to the neutron and alpha particle absorption into the Li-6. As described in Eq.2, the higher the neutron flux ($\emptyset$) or the longer the irradiation time (t) the more tritium ($H^3$) produced. Given the cost of irradiation, the irradiation time (t) and neutron flux ($\emptyset$) is preferably optimized for maximum tritium ($H^3$) production, while minimizing irradiation time (t) and neutron flux ($\emptyset$).

Figure 1B:
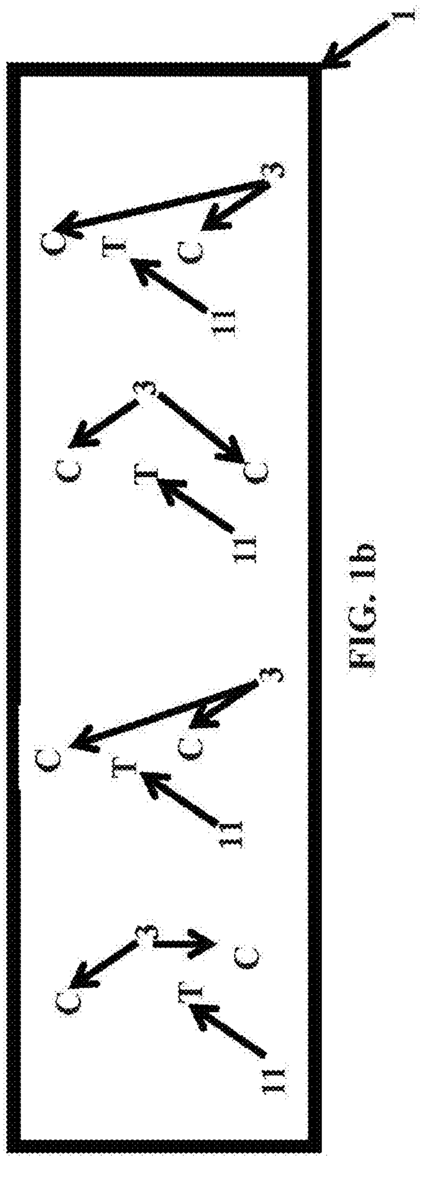
FIG. 1*b* depicts a preferred embodiment of a device for secure, high-density tritium comprising a substrate comprising tritium bonded with carbon, after the precursor in FIG. 1*a* has been transmutated by irradiation with neutrons.

FIG. 1*a* and FIG. 1*b*

FIG. 1 a depicts a preferred embodiment a substrate 1 comprising carbon 3 and a precursor 5. The precursor 5 is intercalated between carbon 3 in the substrate 1. The precursor 5 is irradiated with neutrons 7 from a neutron source 9 to sufficiently transmutate the precursor 5 into tritium.

In a preferred embodiment, the substrate 1 is HOPG and is intercalated with a precursor 5 made of Li-6 and subsequently irradiated with neutrons 7, preferably thermal neutrons, from the neutron source 9. As the recoil energy of the precursor 5 and the neutrons 7 will send the resulting tritium nucleus less than 0.1 mm through the matrix of the substrate 1, the substrate 1 along the path of the majority of neutrons 7 is preferably at least 0.1 mm. Therefore, the step of irradiating the precursor 7 comprises producing neutrons 7 whereby the majority of the produced neutrons 7 travel along the thickness, preferably at least 0.1 mm, of the substrate 1. This embodiment is preferred, as the transmutation of the precursor 5 to tritium will leave behind an unbound electron, which can in effect recombine with then bond tritium to carbon within the matrix of the substrate 1. Furthermore, the precursor 5 may be loaded uniformly into the substrate 1 at relatively high levels. Some matrix damage to the substrate 1 is expected from the recoil event and ionization pathway, but those defects or vacancies become additional sites for tritium to bond. It should be noted the when the precursor 5 is loaded into the substrate 1 the resulting lithiated substrate 1 is oxygen and water sensitive until it is sufficiently tritiated into the more stable form, as shown in FIG. 1*b*.

The neutron source 9 generates neutrons, preferably thermal neutrons. In a preferred embodiment, the neutron source 9 is a nuclear reactor, preferably a thermal reactor. In one embodiment, the neutron source 9 is a compact neutron source, for example as described in Ser. No. 12/303,851, hereby fully incorporated by reference.

FIG. 1*b* depicts a preferred embodiment of a device for secure, high-density tritium comprising a substrate 1 comprising carbon 3 and tritium 11, after the precursor 5 in FIG. 1*a* has been transmutated by irradiation with neutrons 7 from the neutron source 9. The tritium 11 bonds with the carbon 3 from the substrate 1. Although, for simplicity, all of the precursor 5 shown in FIG. 1*a* is shown as transmutated in FIG. 1*b*, any portion of the precursor 5 may be transmutated. At least a portion, preferably a majority, of the precursor 5 in FIG. 1*a* is transmutated into tritium 11, however depending on factors such as neutron energy, exposure time, substrate material, etc., not all of the precursor 5 may be transmutated into tritium 11.

Figure 2A:
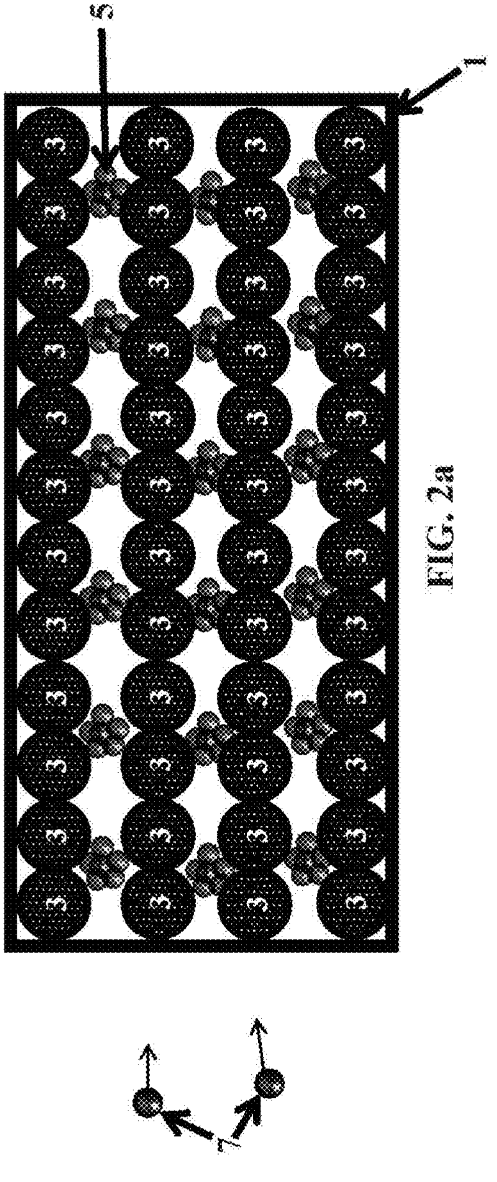
FIG. 2*a* depicts a simplified view of the matrix of a substrate of a preferred embodiment of a substrate comprising precursor intercalated between carbon in the substrate.
Figure 2B:
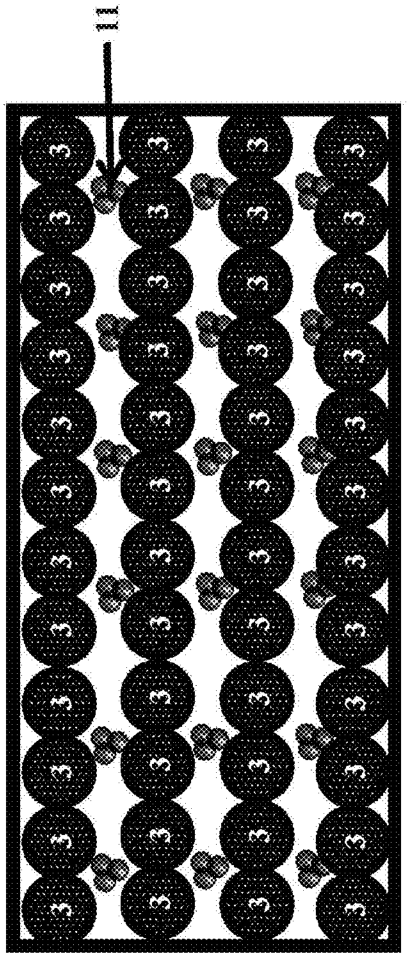
FIG. 2*b* depicts a simplified view of the matrix of the substrate of a preferred embodiment of a device for secure, high-density tritium comprising a substrate comprising tritium bonded with carbon, after the precursor in FIG. 1*a* has been transmutated by irradiation with neutrons.

FIG. 2*a* and FIG. 2*b*

FIG. 2*a* depicts a simplified view of the matrix of a substrate of a preferred embodiment of a substrate 1 comprising precursor 5 intercalated between carbon 3 in the substrate. The precursor 5 is intercalated between carbon 3 in the substrate 1. The precursor 5 is irradiated with neutrons 7 from a neutron source (not shown for simplicity) to sufficiently transmutate precursor 5 into tritium, shown in FIG. 2*b*.

FIG. 2*b* depicts a simplified view of the matrix of the substrate of a preferred embodiment of a device for secure, high-density tritium comprising a substrate 1 comprising tritium 11 bonded with carbon 3, after the precursor in FIG. 1*a* has been transmutated by irradiation with neutrons 7. The tritium 11 bonds with the carbon 3 from the substrate 1. Although, for simplicity, all of the precursor 5 shown in FIG. 2*a* is shown as transmutated in FIG. 2*b*, any portion of the precursor 5 may be transmutated. At least a portion, preferably a majority, of the precursor 5 in FIG. 2*a* is transmutated into tritium 11, however depending on factors such as neutron energy, exposure time, substrate material, etc., not all of the precursor 5 may be transmutated into tritium 11.

FIG. 3*a*

Figure 3B:
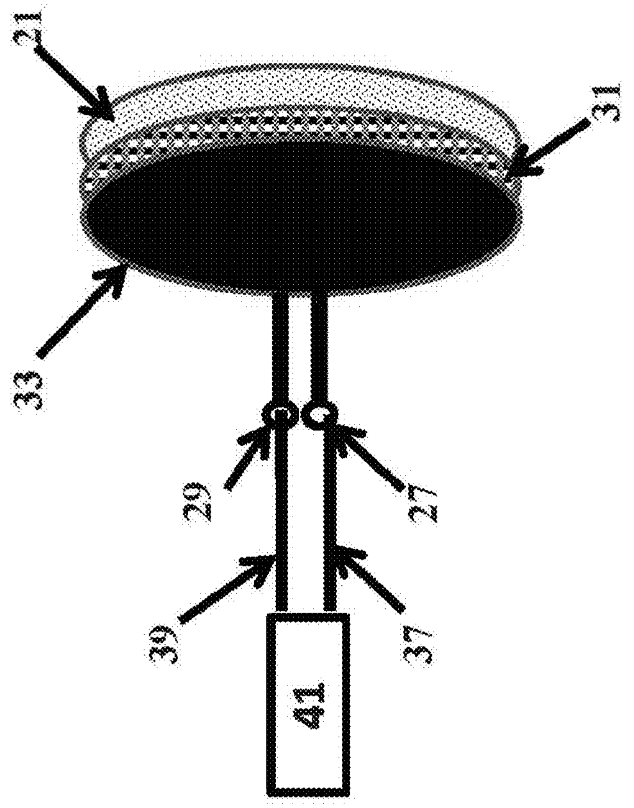
FIG. 3*b* depicts on preferred embodiment of a device for secure, high-density tritium used to generate electricity using indirect energy conversion.
Figure 3A:
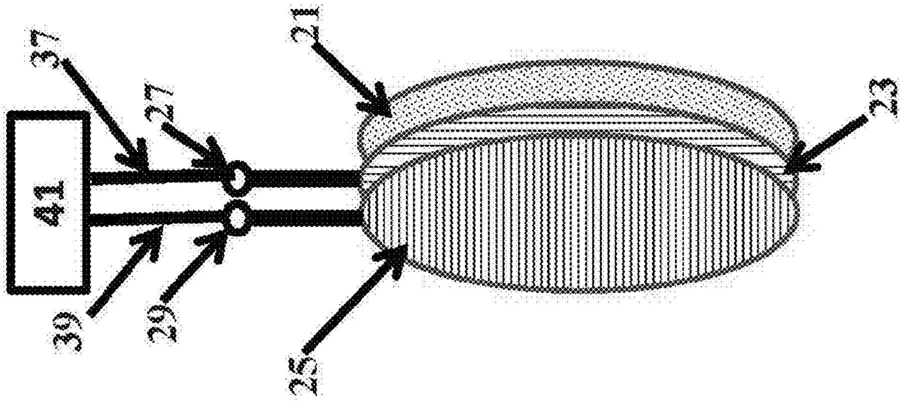
FIG. 3*a* depicts on preferred embodiment of secure, high-density tritium used to generate electricity using direct energy conversion.

FIG. 3*a* depicts on preferred embodiment of secure, high-density tritium used to generate electricity using direct energy conversion. As shown in FIG. 3*a*, the device comprises a bonded tritium 21, as described above, a p-type semiconductor 23, an n-type semiconductor 25, a first electrode 27, a second electrode 29, a first wire 37, a second wire 39, and an electrical load 41. The n-type semiconductor 25 is positioned in electron communication with the p-type semiconductor 25, allowing electron communication between the n-type semiconductor 25 and p-type semiconductor 23. For example, the n-type semiconductor 25 and p-type semiconductor 23 may be positioned juxtaposed together allowing electrons to pass through the adjacent surfaces. In another exemplary embodiment, the n-type semiconductor 25 and p-type semiconductor 23 are separated by an electron conductor, for example an intrinsic semiconductor or other electron conductor, allowing electrons to pass through the adjacent surfaces.

The first electrode 27 is electrically connected to the p-type semiconductor 23 and the first wire 37. The second electrode 29 is electrically connected to the n-type semiconductor 25 and the second wire 39. As electrons are generated via beta decay from the bonded tritium 21, the electrons are captured by holes in the p-type semiconductor 23, thereby generating electricity across the first electrode 27 and second electrode 29. The first wire 37 and the second wire 39 are electrically connected to an electrical load 41, thereby providing electricity to the electrical load 41. In the alternative, any one or more electrical conductors may connect the n-type semiconductor 25 and the p-type semiconductor 23 to the electrical load 41. The electrical load 41 is any electrical device capable of consuming or storing electricity, for example, but not limited to, rechargeable batteries, capacitors, lights, motors, computers, etc.

Preferably, the p-type semiconductor 23 is made of doped GaP, AlGaAs or silicon. Preferably, the n-type semiconductor 25 is made of doped GaP, AlGaAs or silicon.

FIG. 3*b*

FIG. 3*b* depicts on preferred embodiment of a device for secure, high-density tritium used in generate electricity using indirect energy conversion. As shown in FIG. 3*b*, the device comprises a bonded tritium 21, as described above, a phosphor screen 31, a photocell 33, a first electrode 27, a second electrode 29, a first wire 37, a second wire 39, and an electrical load 41. The phosphor screen 31 is positioned to receive at least a portion of said beta decay from said bonded tritium 21. The photocell 33 is positioned to receive at least some photons, preferably at least a majority of photons, emitted by the phosphor screen 31. Preferably, the phosphor screen 31 is positioned between the bonded tritium 21 and the photocell 33, as shown in FIG. 3*b*. The first electrode 27 and the second electrode 29 are both electrically connected to the photocell 33. As electrons are generated via beta decay from the bonded tritium 21, the electrons impinge upon the phosphor screen 31. As the electrons are absorbed by the phosphor screen 31, photons are emitted by the phosphor screen 31. The photons emitted by the phosphor screen 31 are then absorbed by the photocell 33, thereby generating electricity across the first electrode 27 and the second electrode 29.

The first electrode 27 is electrically connected to the electrical load 41 via a first wire 37. The second electrode 29 is electrically connected to the electrical load 41 via a second wire 39. In the alternative, any one or more electrical conductors may connect the photocell 33 to the electrical load 41. The electrical load 41 is any electrical device capable of consuming or storing electricity, for example, but not limited to, rechargeable batteries, capacitors, lights, motors, computers, etc.

Phosphor screen 31 is any material which emits photons in response to electrons produced by beta decay from the bonded tritium 21. Preferably, the phosphor screen 31 is a thin film phosphors, more preferably ZnS:Mn or gallate films.

The photocell 31 is any device comprising photovoltaic material capable of converting the photons produced by the phosphor screen 31 into electricity. Preferably, as photons are absorbed by the photocell 31, the photons of light excite electrons into a higher state of energy, allowing them to act as charge carriers, thereby providing an electric current. Preferably, the photocell 31 comprises a photosensitive cathode and an anode. The cathode of the photocell 31 emits electrons when exposed to photons produced by the phosphor screen 31. The anode of the photocell 31 collect electrons emitted by the cathode of the photocell 31, thereby generating electricity across the first electrode 27 and the second electrode 29. Preferably, the photocell 31 comprises a photovoltaic material, preferably thin-film solar cells (e.g. CdTe CIGS, amorphous Si, microcrystalline Si).

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C.§112, ¶6. In particular, the use of "step of" in the claims herein is not intended to invoke the provisions of 35 U.S.C.§112, ¶6.

The invention claimed is:

1. A method for producing bonded tritium or a method of utilizing the produced bonded tritium, comprising:
a. providing a substrate comprising carbon;
b. intercalating a precursor between said carbon in said substrate;
c. irradiating said precursor intercalated in said substrate until at least a portion of said precursor is transmutated into tritium forming bonded tritium, tritium bonded with carbon from said substrate; and
d. said tritium producing beta decay comprising electrons.

2. The method for producing bonded tritium or a method of utilizing the produced bonded tritium of claim 1 whereby said step of irradiating said precursor intercalated in said substrate comprises:
a. irradiating said precursor intercalated in said substrate until at least a majority of said precursor is transmutated into tritium forming bonded tritium, tritium bonded with carbon from said substrate.

3. The method for producing bonded tritium or a method of utilizing the produced bonded tritium of claim 1 whereby:
a. said substrate is a substrate from the list of substrates consisting of highly-ordered pyrolytic graphite, carbon fibers, carbon nanotubes, buckministerfullerenes, and combinations thereof.

4. The method for producing bonded tritium of or a method of utilizing the produced bonded tritium claim 1 whereby:
a. said substrate is highly-ordered pyrolytic graphite comprised of graphene layers and graphene rings;
b. the space between the graphene layers and individually spaced under the graphene rings comprises an interplanar space; and
c. the atoms of said precursor are located in said interplanar space.

5. The method for producing bonded tritium or a method of utilizing the produced bonded tritium of claim 1 whereby:
a. said precursor is lithium-6.

6. The method for producing bonded tritium or a method of utilizing the produced bonded tritium of claim 5 whereby;
a. said step of intercalating a precursor between said carbon in said substrate comprises bonding said precursor with at least a portion of said carbon of said substrate forming at least a portion of $^6LiC_6$.

7. The method for producing bonded tritium or a method of utilizing the produced bonded tritium of claim 1 whereby said precursor is boron-10.

8. The method for producing bonded tritium or a method of utilizing the produced bonded tritium of claim 1 further comprising:
a. said step of irradiating said precursor intercalated in said substrate comprises irradiating said precursor intercalated in said substrate with thermal neutrons.

9. The method for producing bonded tritium or a method of utilizing the produced bonded tritium of claim 8 whereby:
a. said precursor is lithium-6.

10. The method for producing bonded tritium or a method of utilizing the produced bonded tritium of claim 9 whereby:
a. said step of intercalating a precursor between said carbon in said substrate comprises bonding said precursor with at least a portion of said carbon of said substrate forming at least a portion of $^6LiC_6$.

11. The method for producing bonded tritium or a method of utilizing the produced bonded tritium of claim 10 whereby:
a. said step of providing a substrate comprises providing a highly-ordered pyrolytic graphite substrate comprised of graphene layers and graphene lings;
b. the space between the graphene layers and individually spaced under the graphene rings comprises an interplanar space; and
c. said step of intercalating a precursor comprises intercalating the atoms of a precursor in said interplanar space.

12. The method for producing bonded tritium or a method of utilizing the produced bonded tritium of claim 11 whereby:
a. said substrate has a thickness of at least 0.1 mm; and
b. said step of irradiating said precursor comprises producing neutrons and at least a majority of said produced neutrons travel through said thickness of said substrate.

13. The method for producing bonded tritium or a method of utilizing the produced bonded tritium of claim 1 further comprising:
a. providing a p-type semiconductor and an n-type semiconductor;
b. positioning said p-type semiconductor in electron communication with said n-type semiconductor, thereby forming a p-n junction; and
c. positioning said p-n junction to receive at least a portion of said beta decay from said bonded tritium.

14. The method for producing bonded tritium or a method of utilizing the produced bonded tritium of claim 13 whereby:
a. said p-type semiconductor comprises GaP, AlGaAs or silicon; and
b. said n-type semiconductor comprises GaP, AlGaAs or silicon.

15. The method for producing bonded tritium or a method of utilizing the produced bonded tritium of claim 1 further comprising:
a. providing a phosphor screen and a photocell;
b. positioning said phosphor screen to receive at least a portion of said beta decay from said bonded tritium;
c. positioning said photocell to receive at least some photons emitted by said phosphor screen; and
d. generating electricity at said photocell after receiving at least some photons omitted by said phosphor screen.

16. The method for producing bonded tritium or a method of utilizing the produced bonded tritium of claim 15 whereby said phosphor screen comprises ZnS:Mn or gallate film.

* * * * *